(12) United States Patent
Yu et al.

(10) Patent No.: US 9,443,785 B2
(45) Date of Patent: Sep. 13, 2016

(54) SEMICONDUCTOR PACKAGE (71) Applicant: Advanced Semiconductor Engineering, Inc., Kaohsiung (TW)

(72) Inventors: Cheng-Hsien Yu, Kaohsiung (TW); Wen Tsung Hsu, Kaohsiung (TW); Chun Yuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/577,904

(22) Filed: Dec. 19, 2014

(65) Prior Publication Data

US 2016/0181176 A1  Jun. 23, 2016

(51) Int. Cl.
*H01L 23/48* (2006.01)
*H01L 23/367* (2006.01)
*H01L 23/31* (2006.01)
*H01L 23/498* (2006.01)
*H01L 25/18* (2006.01)
*H01L 25/065* (2006.01)
*H01L 23/538* (2006.01)

(52) U.S. Cl.
CPC ....... *H01L 23/3675* (2013.01); *H01L 23/3107* (2013.01); *H01L 23/49838* (2013.01); *H01L 23/5389* (2013.01); *H01L 25/0652* (2013.01); *H01L 25/0655* (2013.01); *H01L 25/18* (2013.01); *H01L 2225/06555* (2013.01); *H01L 2225/06589* (2013.01)

(58) Field of Classification Search
CPC ........... H01L 23/3107; H01L 23/3675; H01L 23/49838; H01L 23/5389; H01L 25/0655; H01L 25/0652
See application file for complete search history.

(56) References Cited

U.S. PATENT DOCUMENTS

| | | | | |
|---|---|---|---|---|
| 8,053,876 B2* | 11/2011 | Kummerl | ............ | H01L 23/4334 257/675 |
| 8,345,441 B1* | 1/2013 | Crisp | ................. | H01L 25/0652 361/770 |
| 8,367,475 B2* | 2/2013 | Law | ....................... | H01L 24/81 438/113 |
| 8,587,123 B2 | 11/2013 | Law et al. | | |
| 8,780,561 B2* | 7/2014 | Danello | ................ | H01L 23/433 257/704 |
| 2008/0277800 A1* | 11/2008 | Hwang | ................. | H01L 23/481 257/777 |

* cited by examiner

*Primary Examiner* — Nicholas Tobergte
(74) *Attorney, Agent, or Firm* — Foley & Lardner LLP; Cliff Z. Liu; Angela D. Murch (57) ABSTRACT

The present disclosure relates to a semiconductor package. In an embodiment, the semiconductor package includes a substrate, a semiconductor device, a thermal conductive element and a molding compound. The semiconductor device is mounted to the substrate. The thermal conductive element is disposed above the semiconductor device. The molding compound covers a side surface of the substrate and at least a part of a side surface of the semiconductor device.

20 Claims, 11 Drawing Sheets

SEMICONDUCTOR PACKAGE

BACKGROUND

1. Technical Field

The present disclosure relates to a semiconductor package. In particular, the present disclosure relates to a semiconductor package having a molding compound covering a side surface of a substrate.

2. Description of the Related Art

Integrated circuit (IC) chips or dice are typically interfaced with other circuits using a package that can be attached to a printed circuit board. Example package types include ball grid array (BGA) or land grid array (LGA) packages. One type of BGA or LGA package has one or more IC dice attached to a top surface of a package substrate, and an array of solder balls or land pads located on a bottom surface of the package substrate.

To establish an effective electrical connection between a die and a printed circuit board, the package substrate of the package is typically manufactured to include a single or multiple conductive layers, laminated together with a dielectric material therein before a die is attached thereon. Such package substrate is typically manufactured in a panel format. The panel is then cut into individual package pieces as the package construction finishes.

To improve the yield and reduce cost of such process, the package substrate panel is cut into individual substrate pieces and tested before mounting a die thereon, wherein faulty substrates are discarded and substrates known to be good will be reconstituted on a panel/strip to be proceed with further packaging process. The reconstituted substrate panels/strips are referred to as reconstitution substrate panels/strips. The individual substrates that form a reconstitution substrate panel/strip are referred to as individual reconstitution substrates. Such reconstitution substrate panels/strips enable a variety of packaging options which can be cost and performance effective according to the particular application(s) being implemented in the package.

Nevertheless, as the packaging options increase and techniques to package multiple dice in one package become available, how to effectively dissipate the heat generated by the multiple dice in such package without compromising the size requirement of the package becomes an important issue need to be resolved before such techniques can be truly applied in the industry.

SUMMARY

An aspect of the present disclosure relates to a semiconductor package. In an embodiment, the semiconductor package comprises a substrate, a semiconductor device, a thermal conductive element and a molding compound. The semiconductor device is mounted to the substrate. The thermal conductive element is disposed above the semiconductor device. The molding compound covers a side surface of the substrate and at least a part of a side surface of the semiconductor device.

In an embodiment, a side surface of the molding compound is coplanar with a side surface of the thermal conductive element.

In an embodiment, the molding compound covers the entire side surface of the semiconductor device, and the molding compound further covers a part of a side surface of the thermal conductive element.

In an embodiment, the molding compound covers a top surface of the semiconductor device.

Another aspect of the present disclosure relates to a semiconductor package. In an embodiment, the semiconductor package comprises a first substrate, a second substrate, a first semiconductor device, a second semiconductor device, a first thermal conductive element and a molding compound. The first semiconductor device is mounted to the first substrate. The second semiconductor device is mounted to the second substrate. The first thermal conductive element is disposed above the first semiconductor device. The molding compound covers a side surface of the first substrate, a side surface of the second substrate, at least a part of a side surface of the first semiconductor device and at least a part of a side surface of the second semiconductor device.

In an embodiment, the first semiconductor device is different from the second semiconductor device.

In an embodiment, the first thermal conductive element is disposed above the first semiconductor device and the second semiconductor device.

In an embodiment, the semiconductor package further comprises a second thermal conductive element disposed above the second semiconductor device, wherein a size of the first thermal conductive element is different from a size of the second thermal conductive element.

In an embodiment, the molding compound covers the entire side surfaces of the first semiconductor device and the second semiconductor device, and the molding compound further covers a part of a side surface of the first thermal conductive element.

In an embodiment, the molding compound covers top surfaces of the first semiconductor device and the second semiconductor device.

Another aspect of the present disclosure relates to a semiconductor package. In an embodiment, the semiconductor package comprises a first substrate, a second substrate, a first semiconductor device, a second semiconductor device, a third substrate and a molding compound. The first semiconductor device is mounted to the first substrate. The second semiconductor device is mounted to the second substrate. The third substrate is disposed above the first semiconductor device and the second semiconductor device, and electrically connected to the first substrate and the second substrate. The molding compound covers a side surface of the first substrate, a side surface of the second substrate, at least a part of a side surface of the first semiconductor device and at least a part of a side surface of the second semiconductor device.

In an embodiment, the first semiconductor device is different from the second semiconductor device.

In an embodiment, a side surface of the molding compound is coplanar with a side surface of the third substrate.

In an embodiment, the molding compound covers the entire side surfaces of the first semiconductor device and the second semiconductor device.

In an embodiment, the molding compound fills a space between the first substrate, the second substrate, and the third substrate.

In an embodiment, the semiconductor package further comprises a third semiconductor device, wherein the third semiconductor device is disposed between the first semiconductor device and the third substrate, and the third semiconductor device is electrically connected to the third substrate.

In an embodiment, the third substrate defines a first opening corresponding to the first semiconductor device, and the molding compound is further disposed in the first opening.

In an embodiment, the semiconductor package further comprises a thermal conductive element disposed above the second semiconductor device.

In an embodiment, the third substrate defines an accommodating cavity for accommodating the third semiconductor device.

In an embodiment, the third semiconductor device is disposed in the first opening.

DETAILED DESCRIPTION

Spatial descriptions, such as "above," "below," "up," "left," "right," "down," "top," "bottom," "vertical," "horizontal," "side," "higher," "lower," "upper," "over", "under," etc., are defined with respect to a certain element or certain plane of an element, as described in the specification and shown in the figures. Furthermore, it should be understood that the spatial descriptions (e.g., "above," "below," "up," "left," "right," "down," "top," "bottom," "vertical," "horizontal," "side," "higher," "lower," "upper," "over", "under," and so forth) used herein are for purposes of illustration only, and that practical implementations of the structures described herein can be spatially arranged in any orientation or manner, provided that the merits of the disclosure are not deviated by such arrangement.

Figure 1:
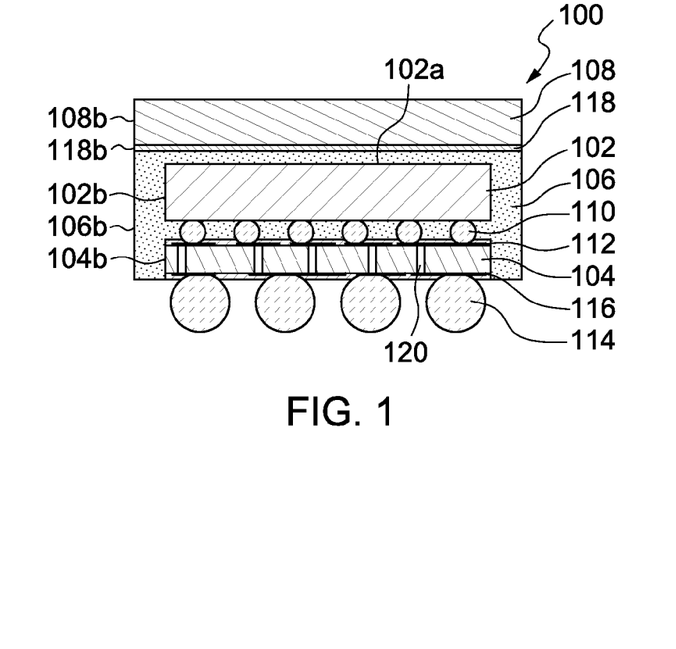
FIG. 1 illustrates a cross-sectional view of a semiconductor package according to an example embodiment of the present disclosure.

FIG. 1 illustrates a cross-sectional view of a semiconductor package 100 according to an embodiment of the present disclosure. As shown in FIG. 1, the semiconductor package 100 includes a semiconductor device 102, such as a semiconductor chip or a die, a substrate 104, a molding compound 106, a thermal conductive element 108 and a plurality of solder balls 114.

The device 102 is mounted to the substrate 104 and is electrically connected to the substrate 104. The device 102 has a top surface 102a and a side surface 102b. In an embodiment, the device 102 may be electrically connected to the top surface of the substrate 104 through a plurality of respective interconnectors 110, such as copper pillars or solder/stud bumps, positioned between respective pads of the device 102 and respective top pads 112 of the substrate 104. Alternatively, the device 102 may be electrically connected to the top surface of the substrate 104 through respective wire bonds or similar connections.

In the embodiment of FIG. 1, the substrate 104 is a package substrate, which can be made of, for example, metal, ceramic, glass-reinforced epoxy (e.g., FR4), polyimide, silicon, or Bismaleimide/Triazine (BT) resin. The substrate 104 has a top surface, a bottom surface, a side surface 104b, a plurality of vias 120, a plurality of top pads 112 and a plurality of bottom pads 116. The side surface 104b is disposed between the top surface and the bottom surface. The top pads 112 are disposed adjacent to the top surface, and the bottom pads 116 are disposed adjacent to the bottom surface. The solder balls 114 may be attached to the bottom surface of the substrate 104 through the respective bottom pads 116 of the substrate 104. The solder balls 114 serve as external connection terminals. The vias 120 extend from the top surface of the substrate 104 to the bottom surface of the substrate 104 and connect the top pads 112 to the bottom pads 116 so that the device 102 may be electrically connected to the external environment through the solder balls 114.

The molding compound 106 covers the side surface 104b of the substrate 104 and at least a part of the side surface 102b of the device 102. The molding compound 106 has a side surface 106b. In this embodiment, the molding compound 106 covers the entire side surface 102b of the device 102 and further covers the top surface 102a of the device 102. Therefore, the side surface 102b of the device 102 and the side surface 104b of the substrate 104 are not exposed from the molding compound 106.

The thermal conductive element 108 is disposed above the device 102. The thermal conductive element 108 is made of a thermal conductive material, such as copper or another metal or metal alloy. The thermal conductive element 108 has a side surface 108b. In this embodiment, the thermal conductive element 108 is disposed above the device 102 by attaching to the molding compound 106 above the device 102 through an adhesive 118. Therefore, the thermal conductive element 108 does not attach to the device 102 directly. In addition, in this embodiment, the side surface 106b of the molding compound 106 is substantially coplanar with the side surface 108b of the thermal conductive element 108 and a side surface 118b of the adhesive 118. Therefore, the molding compound 106 does not cover the side surface 108b of the thermal conductive element 108. In this embodiment, the heat dissipation ability of the semiconductor package 100 can be improved by the thermal conductive element 108 with a corresponding size without compromising a footprint size requirement of the semiconductor package 100.

Figure 2:
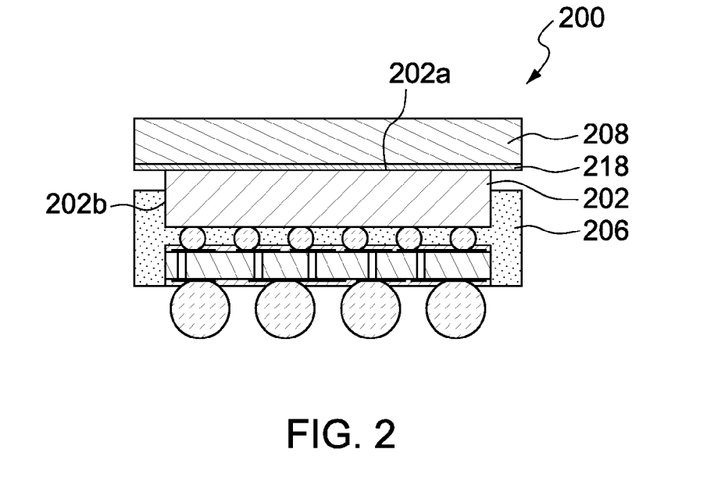
FIG. 2 illustrates a cross-sectional view of a semiconductor package according to another example embodiment of the present disclosure.

FIG. 2 illustrates a cross-sectional view of a semiconductor package 200 according to another embodiment of the present disclosure. The semiconductor package 200 is similar to the semiconductor package 100 illustrated in FIG. 1 except that a molding compound 206 covers only a part of a side surface 202b of a semiconductor device 202 and exposes a portion of the side surface 202b of the device 202. As such, since a portion of the device 202 is exposed from the molding compound 206, the heat dissipation ability of the semiconductor package 200 can be improved. In this embodiment, the molding compound 206 does not exceed the top surface 202a of the device 202. In addition, in this embodiment, a thermal conductive element 208 is directly attached to the device 202 through an adhesive 218.

Figure 3:
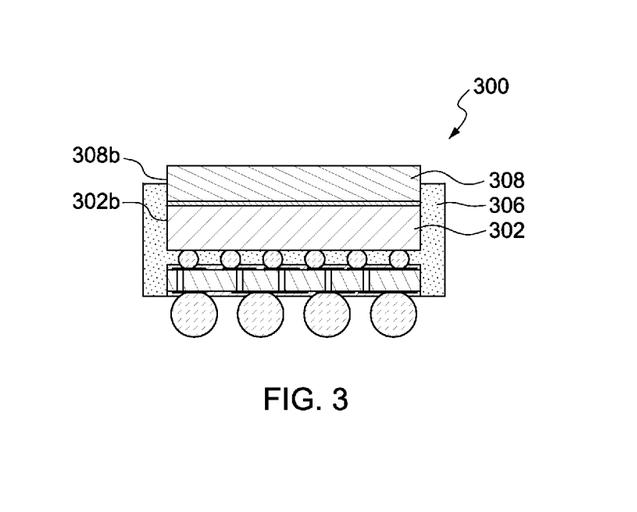
FIG. 3 illustrates a cross-sectional view of a semiconductor package according to another example embodiment of the present disclosure.

FIG. 3 illustrates a cross-sectional view of a semiconductor package 300 according to another embodiment of the present disclosure. The semiconductor package 300 is similar to the semiconductor package 200 illustrated in FIG. 2 except that a thermal conductive element 308 has a side surface 308b that is substantially coplanar with a side surface 302b of a semiconductor device 302, and a molding compound 306 covers the entire side surface 302b of the device 302 and a part of the side surface 308b of the thermal conductive element 308. Therefore, a portion of the side surface 308b of the thermal conductive element 308 is exposed to air. As such, the thermal conductive element 308 is embedded in the molding compound 306, so the thermal conductive element 308 is secured to the device 302 to reduce the possibility that the thermal conductive element 308 peels off from the semiconductor package 300.

Figure 4:
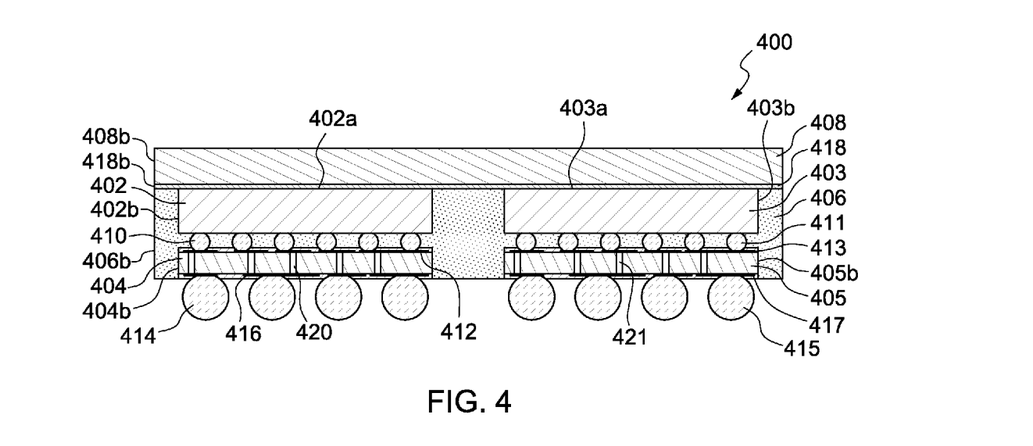
FIG. 4 illustrates a cross-sectional view of a semiconductor package according to another example embodiment of the present disclosure.

FIG. 4 illustrates a cross-sectional view of a semiconductor package 400 according to another embodiment of the present disclosure. The semiconductor package 400 includes a first semiconductor device 402, a second semiconductor device 403, a first substrate 404, a second substrate 405, a molding compound 406, a first thermal conductive element 408, a plurality of first solder balls 414, and a plurality of second solder balls 415.

The first device 402 is mounted to the first substrate 404 and is electrically connected to the first substrate 404. The second device 403 is mounted to the second substrate 405 and is electrically connected to the second substrate 405. The first device 402 has a top surface 402a and a side surface 402b, and the second device 403 has a top surface 403a and a side surface 403b. In an embodiment, the first device 402 may be electrically connected to the top surface of the first substrate 404 through a plurality of respective interconnectors 410, such as copper pillars or solder/stud bumps, positioned between respective pads of the first device 402 and respective top pads 412 of the first substrate 404. The second device 403 may be electrically connected to the top surface of the second substrate 405 through a plurality of respective interconnectors 411, such as copper pillars or solder/stud bumps, positioned between respective pads of the second device 403 and respective top pads 413 of the second substrate 405.

The first substrate 404 is a package substrate, which can be made of, for example, metal, ceramic, FR4, polyimide, Si or BT resin. The first substrate 404 has a top surface, a bottom surface, a side surface 404b, a plurality of vias 420, a plurality of top pads 412 and a plurality of bottom pads 416. The side surface 404b is disposed between the top surface and the bottom surface of the first substrate 404. The top pads 412 are disposed adjacent to the top surface of the first substrate 404, and the bottom pads 416 are disposed adjacent to the bottom surface of the first substrate 404. The first solder balls 414 may be attached to the bottom surface of the first substrate 404 through the respective bottom pads 416 of the first substrate 404. The first solder balls 414 serve as external connection terminals. The vias 420 extend from the top surface of the first substrate 404 to the bottom surface of the first substrate 404 and connect the top pads 412 to the bottom pads 416 so that the first device 402 may be electrically connected to the external environment through the first solder balls 414.

The second substrate 405 is a package substrate, which can be made of, for example, metal, ceramic, FR4, polyimide, Si or BT resin. The second substrate 405 has a top surface, a bottom surface, a side surface 405b, a plurality of vias 421, a plurality of top pads 413 and a plurality of bottom pads 417. The side surface 405b is disposed between the top surface and the bottom surface of the substrate 405. The top pads 413 are disposed adjacent to the top surface of the substrate 405, and the bottom pads 417 are disposed adjacent to the bottom surface of the substrate 405. The second solder balls 415 may be attached to the bottom surface of the second substrate 405 through the respective bottom pads 417 of the second substrate 405. The second solder balls 415 serve as external connection terminals. The vias 421 extend from the top surface of the second substrate 405 to the bottom surface of the second substrate 405 and connect the top pads 413 to the bottom pads 417 so that the second device 403 may be electrically connected to the external environment through the second solder balls 415.

The molding compound 406 covers the side surface 404b of the first substrate 404, at least a part of the side surface 402b of the first device 402, the side surface 405b of the second substrate 405 and at least a part of the side surface 403b of the second device 403. The molding compound 406 has a side surface 406b. In this embodiment, the molding compound 406 covers the entire side surface 402b of the first device 402 and the entire side surface 403b of the second device 403. In this embodiment, the molding compound 406 does not extend beyond the top surface 402a of the first device 402 and the top surface 403a of the second device 403. Alternatively, the molding compound 406 may cover the top surface 402a of the first device 402 and the top surface 403a of the second device 403.

The first thermal conductive element 408 is disposed above the first device 402. In the embodiment of FIG. 4, the first thermal conductive element 408 extends above the second device 403, so that the first thermal conductive element 408 is disposed above the first device 402 and above the second device 403. The first thermal conductive element 408 is made of a thermal conductive material, such as copper. The first thermal conductive element 408 has a side surface 408b. In this embodiment, the first thermal conductive element 408 is disposed above the first device 402 and the second device 403 by attaching to the first device 402, the second device 403 and the molding compound 406 through an adhesive 418. In addition, in this embodiment, the side surface 406b of the molding compound 406 is substantially coplanar with the side surface 408b of the thermal conductive element 408 and a side surface 418b of the adhesive 418. In this embodiment, the heat dissipation ability of the semiconductor package 400 can be improved by the first thermal conductive element 408 with a corresponding size that will not increase the footprint size of the semiconductor package 400.

In this embodiment, the first substrate 404 and the second substrate 405 are reconstitution substrates made from a reconstitution panel or strip. As such, the first substrate 404 and the second substrate 405 may be the same or different. For example, the first substrate 404 and the second substrate 405 may be made of a same or a different material; or the first substrate 404 and the second substrate 405 may have a same or a different layer counts (e.g., metal layer counts); or the first substrate 404 and the second substrate 405 may have a same or a different size. In addition, the first device 402 and the second device 403 may be the same or different. For example, the first device 402 and the second device 403 may be the same or different type; the first device 402 and the second device 403 may have same or different function; or the first device 402 and the second device 403 may have same or different size. In actual use, the first substrate 404 and the second substrate 405 are customized according to the characteristics of the device attached thereon. For example, the layer count, the size, and/or the material of the first substrate 404 may be selected according to the characteristics of the first device 402; and the layer count, the size, and/or the material of the second substrate 405 may be selected according to the characteristics of the second device 403. Therefore, these embodiments enable a variety of packaging options, wherein different substrates and different dice can be packaged together.

Figure 4A:
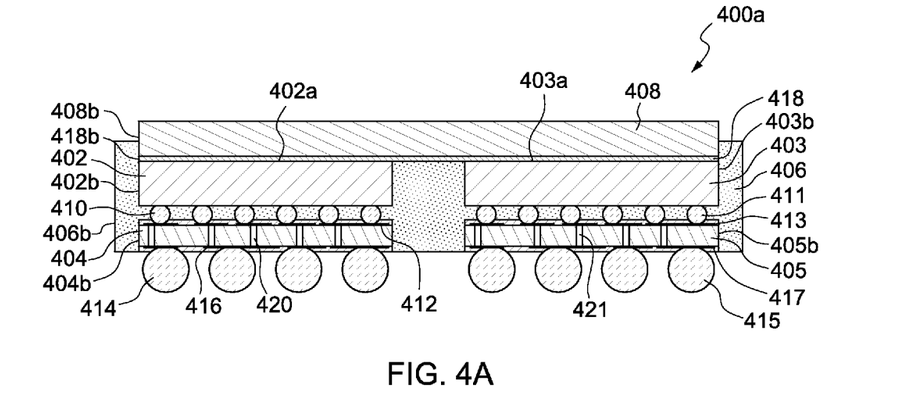
FIG. 4A illustrates a cross-sectional view of a semiconductor package according to another example embodiment of the present disclosure.

FIG. 4A illustrates a cross-sectional view of a semiconductor package 400a according to another embodiment of the present disclosure. The semiconductor package 400a is similar to the semiconductor package 400 illustrated in FIG. 4 except that the molding compound 406 further covers a part of the side surface 408b of the first thermal conductive element 408. As such, the first thermal conductive element 408 is embedded in the molding compound 406, so that the first thermal conductive element 408 is secured to the first device 402 and the second device 403 to reduce the possibility that the first thermal conductive element 408 peels off from the semiconductor package 400a.

Figure 4B:
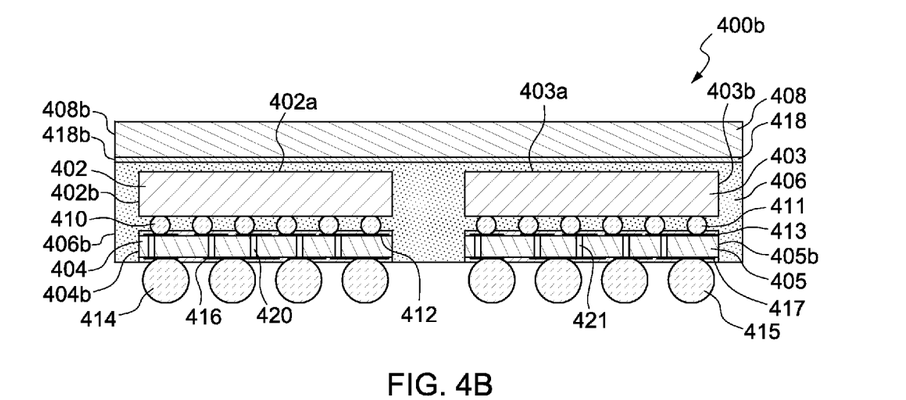
FIG. 4B illustrates a cross-sectional view of a semiconductor package according to another example embodiment of the present disclosure.

FIG. 4B illustrates a cross-sectional view of a semiconductor package 400b according to another embodiment of the present disclosure. The semiconductor package 400b is similar to the semiconductor package 400 illustrated in FIG. 4 except that the molding compound 406 covers the top surface 402a of the first device 402 and the top surface 403a of the second device 403, and the first thermal conductive element 408 is attached to the molding compound 406 above the first device 402 and the second device 403 through the adhesive 418.

Figure 5:
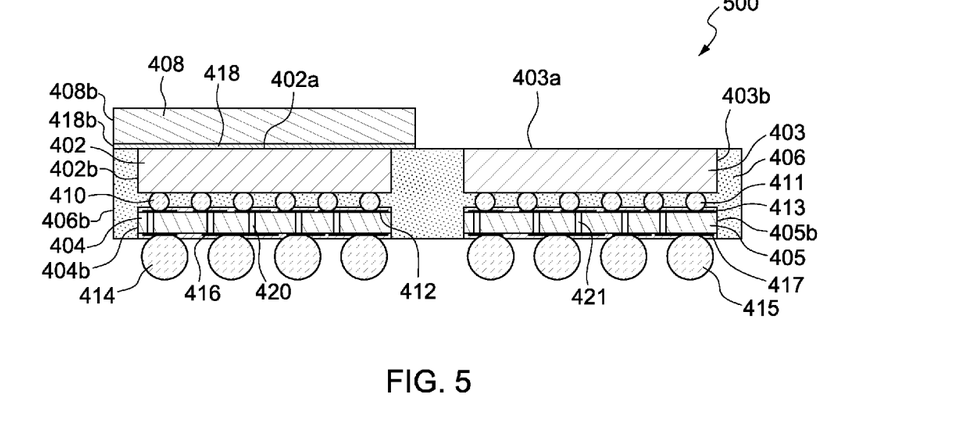
FIG. 5 illustrates a cross-sectional view of a semiconductor package according to another example embodiment of the present disclosure.

FIG. 5 illustrates a cross-sectional view of a semiconductor package 500 according to another embodiment of the present disclosure. The semiconductor package 500 is similar to the semiconductor package 400 illustrated in FIG. 4 except that the top surface 403a of the second device 403 is exposed from the molding compound 406 and the first thermal conductive element 408 is disposed only above the first device 402. That is, the first thermal conductive element 408 does not extend to the position above the second device 403. As such, the first thermal conductive element 408 only has a side surface 408b that is substantially coplanar with the side surface 406b of the molding compound 406 that is near to the first device 402.

Figure 6:
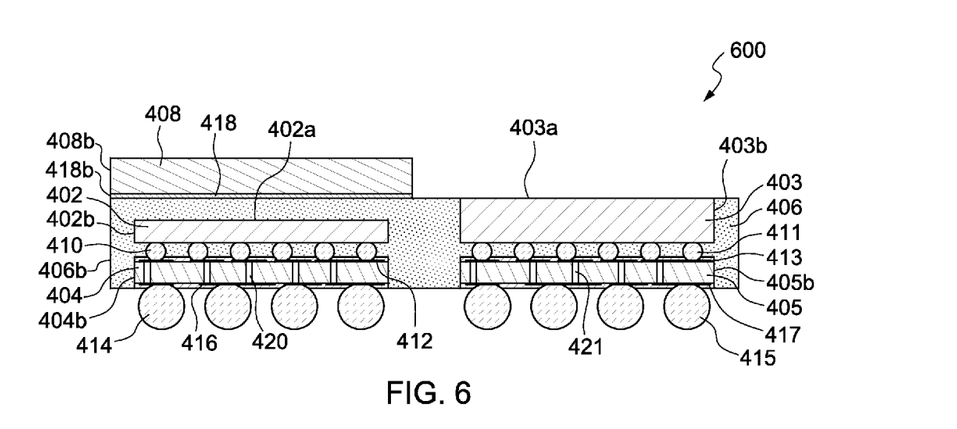
FIG. 6 illustrates a cross-sectional view of a semiconductor package according to another example embodiment of the present disclosure.

FIG. 6 illustrates a cross-sectional view of a semiconductor package 600 according to another embodiment of the present disclosure. The semiconductor package 600 is similar to the semiconductor package 500 illustrated in FIG. 5 except that the first device 402 and the second device 403 are different in size (and may be different in function). In this embodiment, the thickness of the first device 402 is less than that of the second device 403.

Figure 7:
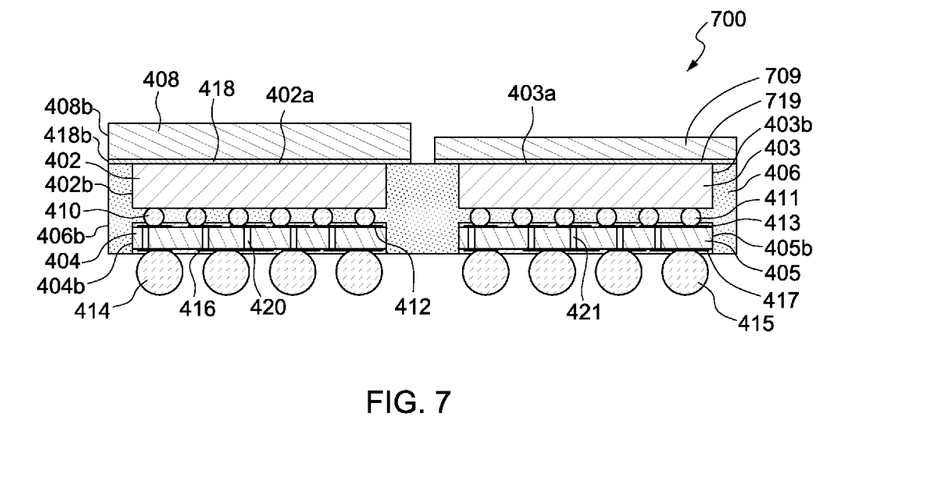
FIG. 7 illustrates a cross-sectional view of a semiconductor package according to another example embodiment of the present disclosure.

FIG. 7 illustrates a cross-sectional view of a semiconductor package 700 according to another embodiment of the present disclosure. The semiconductor package 700 is similar to the semiconductor package 500 illustrated in FIG. 5 except that in addition to the first thermal conductive element 408 disposed above the first device 402, a second thermal conductive element 709 is disposed above the second device 403. In this embodiment, the second thermal conductive element 709 is disposed above the second device 403 by attaching to the second device 403 and the molding compound 406 through a second adhesive 719. As shown in FIG. 7, the size of the first thermal conductive element 408 is different from the size of the second thermal conductive element 709. In this embodiment, the thickness of the first thermal conductive element 408 is greater than that of the second thermal conductive element 709.

Figure 8:
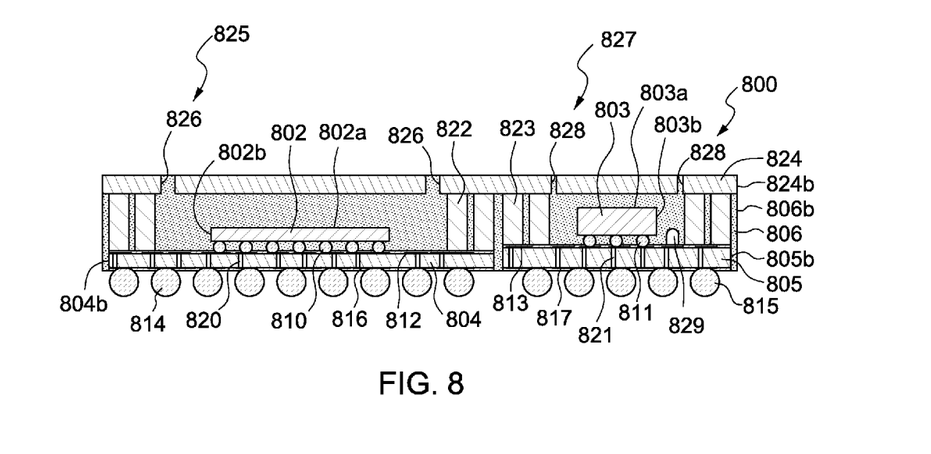
FIG. 8 illustrates a cross-sectional view of a semiconductor package according to another example embodiment of the present disclosure.

FIG. 8 illustrates a cross-sectional view of a semiconductor package 800 according to an embodiment of the present disclosure. The semiconductor package 800 includes a first semiconductor device 802, a second semiconductor device 803, a first substrate 804, a second substrate 805, a molding compound 806, a third substrate 824, a plurality of first solder balls 814, a plurality of second solder balls 815, a plurality of first electrical connecting elements 822 and a plurality of second electrical connecting elements 823.

The first device 802 is mounted to the first substrate 804 and is electrically connected to the first substrate 804. The second device 803 is mounted to and is electrically connected to the second substrate 805. The first device 802 has a top surface 802a and a side surface 802b, and the second device 803 has a top surface 803a and a side surface 803b. In an embodiment, the first device 802 is electrically connected to the top surface of the first substrate 804 through a plurality of respective first interconnectors 810, such as copper pillars or solder/stud bumps, positioned between respective pads of the first device 802 and respective top pads 812 of the first substrate 804; and the second device 803 is electrically connected to the top surface of the second substrate 805 through a plurality of respective interconnectors 811, such as copper pillars or solder/stud bumps, deposited on respective pads of the second device 803 and on respective top pads 813 of the second substrate 805.

The first substrate 804 is a package substrate, which can be made of, for example, metal, ceramic, FR4, polyimide, Si or BT resin. The first substrate 804 has a top surface, a bottom surface, a side surface 804b, a plurality of vias 820, a plurality of top pads 812 and a plurality of bottom pads 816. The side surface 804b is disposed between the top surface and the bottom surface of the substrate 804. The top pads 812 are disposed adjacent to the top surface of the substrate 804, and the bottom pads 816 are disposed adjacent to the bottom surface of the substrate 804. The first solder balls 814 may be attached to the bottom surface of the first substrate 804 through the respective bottom pads 816 of the first substrate 804. The first solder balls 814 serve as external connection terminals. The vias 820 extend from the top surface of the first substrate 804 to the bottom surface of the first substrate 804 and connect the top pads 812 to the bottom pads 816 so that the first device 802 may be electrically connected to the external environment through the first solder balls 814.

The second substrate 805 is a package substrate, which can be made of, for example, metal, ceramic, FR4, polyimide, Si or BT resin. The second substrate 805 has a top surface, a bottom surface, a side surface 805b, a plurality of vias 821, a plurality of top pads 813 and a plurality of bottom pads 817. The side surface 805b is disposed between the top surface and the bottom surface of the substrate 805. The top pads 813 are disposed adjacent to the top surface of the substrate 805, and the bottom pads 817 are disposed adjacent to the bottom surface of the substrate 805. The second solder balls 815 may be attached to the bottom surface of the second substrate 805 through the respective bottom pads 817 of the second substrate 805. The second solder balls 815 serve as external connection terminals. The vias 821 extend from the top surface of the second substrate 805 to the bottom surface of the second substrate 805 and connect the top pads 813 to the bottom pads 817 so that the second device 803 may be electrically connected to the external environment through the solder balls 815.

The third substrate 824 is an interposer or a package substrate, which can be made of, for example, metal, ceramic, FR4, polyimide, Si or BT resin. The third substrate 824 has a top surface, a bottom surface, and a side surface 824b. The side surface 824b is disposed between the top surface and the bottom surface of the third substrate 824. The third substrate 824 is disposed above the first device 802 and the second device 803. In this embodiment, the third substrate 824 is electrically connected to the first substrate 804 through the first electrical connecting elements 822, and electrically connected to the second substrate 805 through the second electrical connecting elements 823. In an embodiment, the first electrical connecting elements 822 and the second electrical connecting elements 823 may be solder/stud bumps or copper pillars. As such, the third substrate 824 may provide the first substrate 804 and the second substrate 805 more circuit patterning flexibility by providing space for circuit patterning thereon.

In an embodiment, the third substrate 824 may further include a first slot pattern 825 and a second slot pattern 827. The first slot pattern 825 includes four first slots 826, and the second slot pattern 827 includes four second slots 828. Each of the first slots 826 penetrates through the third substrate 824. The first slots 826 are separated from each other, meaning that they do not connect, and from a top view each of the four first slots 826 are positioned along different imaginary lines such that the four imaginary lines together define a shape recognizable as a square. Herein, this is referred to as a substantially square shape. Each of the second slots 828 penetrates through the third substrate 824, and the four second slots 828 are arranged in substantially square shape from top view but they do not connect with each other. The molding compound 806 fills the space between the first substrate 804, the second substrate 805, and the third substrate 824. The molding compound 806 has a side surface 806b. The molding compound 806 covers the side surface 804b of the first substrate 804 and the side surface 805b of the second substrate 805; and further covers the entire side surface 802b of the first device 802 and the entire side surface 803b of the second device 803.

In addition, the side surface 806b of the molding compound 806 is substantially coplanar with the side surface 824b of the third substrate 824. In this embodiment, the molding compound 806 is further disposed in the first slots 826 and the second slots 828, and the top surface of the molding compound 806 is substantially coplanar with the top surface of the third substrate 824. Therefore, the third substrate 824 is "locked" in the molding compound 806, so the adhesion between the third substrate 824 and the molding compound 806 can be increased.

In an embodiment, the semiconductor package 800 may further include at least one passive component 829 mounted to and electrically connected to the second substrate 805 to form a system in package (SIP). The passive component may include, for example, resistor, capacitor and/or inductor.

Figure 9:
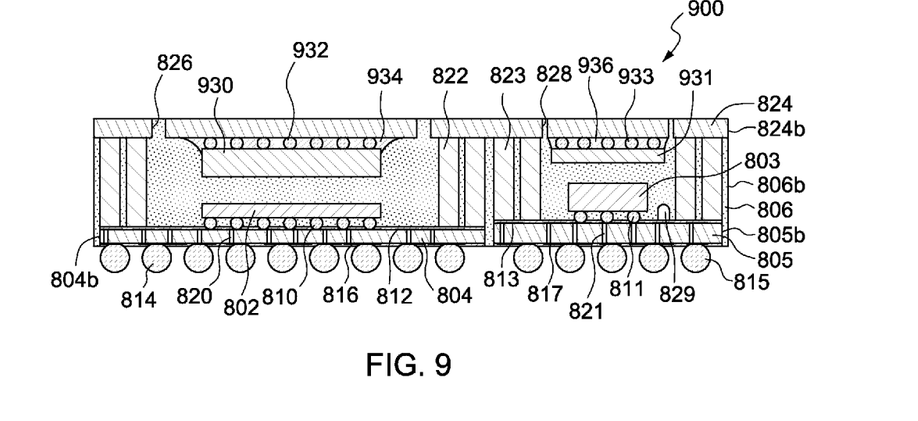
FIG. 9 illustrates a cross-sectional view of a semiconductor package according to another example embodiment of the present disclosure.

FIG. 9 illustrates a cross-sectional view of a semiconductor package 900 according to another embodiment of the present disclosure. The semiconductor package 900 is similar to the semiconductor package 800 illustrated in FIG. 8 except that the third substrate 824 further includes a third semiconductor device 930 and a fourth semiconductor device 931. The third device 930 is disposed between the first device 802 and the third substrate 824, and is mounted to and electrically connected to the third substrate 824. The fourth device 931 is disposed between the second device 803 and the third substrate 824, and is mounted to and electrically connected to the third substrate 824.

In an embodiment, the third device 930 may be electrically connected to the bottom surface of the third substrate 824 through a plurality of respective interconnectors 932, such as copper pillars or solder/stud bumps, and an underfill 934 is used to protect the interconnectors 932. In an embodiment, the fourth device 931 may be electrically connected to the bottom surface of the third substrate 824 through a plurality of respective interconnectors 933, such as copper pillars or solder/stud bumps, and an underfill 936 is used to protect the interconnectors 933. As such, the third device 930 and the fourth device 931 may be electrically connected to the first device 802 and the second device 803 through the third substrate 824, the first electrical connecting elements 822, the second electrical connecting elements 823, the first substrate 804 and the second substrate 805.

Figure 10:
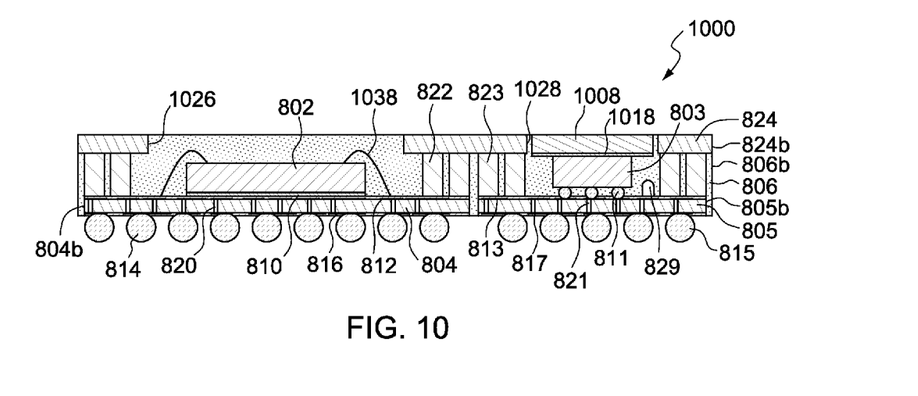
FIG. 10 illustrates a cross-sectional view of a semiconductor package according to another example embodiment of the present disclosure.

FIG. 10 illustrates a cross-sectional view of a semiconductor package 1000 according to another embodiment of the present disclosure. The semiconductor package 1000 is similar to the semiconductor package 900 illustrated in FIG. 9 except that the first device 802 is electrically connected to the first substrate 804 through the bonding wires 1038; and the third substrate 824 has a first opening 1026 and a second opening 1028. The first opening 1026 corresponds to the first device 802, and the size of the first opening 1026 is greater than that of first device 802 so as to prevent the bonding wires 1038 from contacting the third substrate 824. The second opening 1028 corresponds to the second device 803, and the size of the second opening 1028 is greater than that of second device 803 so that a thermal conductive element 1008 can be disposed in the second opening 1028 above the second device 803, and can be attached to the second device 803 through an adhesive 1018. In this embodiment, the molding compound 806 may fill the first opening 1026 and the gap between the side wall of the second opening 1028 and the thermal conductive element 1008. A top surface of the molding compound 806 may be substantially coplanar with the top surface of the third substrate 824.

Figure 11:
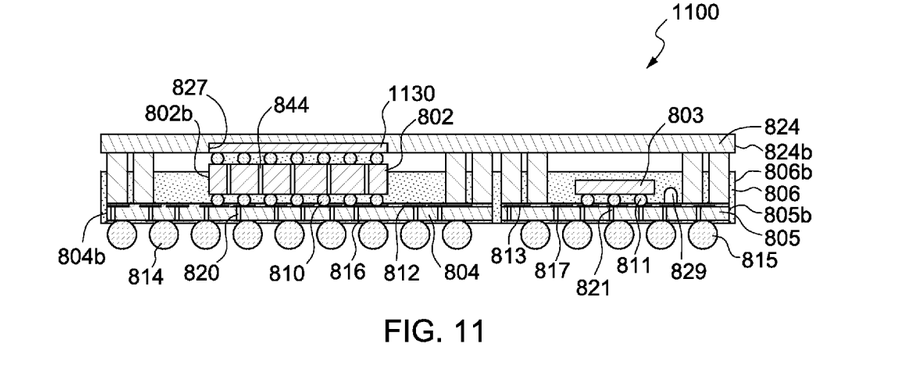
FIG. 11 illustrates a cross-sectional view of a semiconductor package according to another example embodiment of the present disclosure.

FIG. 11 illustrates a cross-sectional view of a semiconductor package 1100 according to another embodiment of the present disclosure. The semiconductor package 1100 is similar to the semiconductor package 800 illustrated in FIG. 8, and the differences therebetween are described as follows. The third substrate 824 has an accommodating cavity 827 for accommodating a third device 1130 disposed above and electrically connected to the first device 802. The molding compound 806 covers only a part of the side surface 802b of the first device 802; and the third substrate 824 has no opening above the second device 803. The first device 802 has a plurality of vias 844, so that the third device 1130 is electrically connected to the first substrate 804 through the vias 844.

Figure 12:
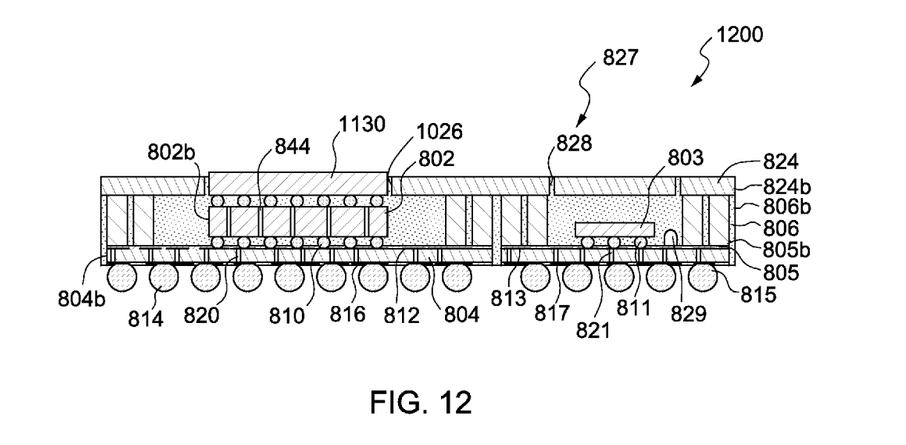
FIG. 12 illustrates a cross-sectional view of a semiconductor package according to another example embodiment of the present disclosure.

FIG. 12 illustrates a cross-sectional view of a semiconductor package 1200 according to another embodiment of the present disclosure. The semiconductor package 1200 is similar to the semiconductor package 1100 illustrated in FIG. 11, and the differences therebetween are described as follows. The third substrate 824 has a first opening 1026 and a second slot pattern 827. The third device 1130 is disposed in the first opening 1026. The second slot pattern 827 includes four second slots 828. Each of the second slots 828 penetrates through the third substrate 824, and the four second slots 828 are arranged in substantially square shape from top view but they do not connect each other. The molding compound 806 fills the space between the first substrate 804, the second substrate 805, and the third substrate 824, and further is disposed in the gap between the side wall of the first opening 1026 and the third device 1130, and in the second slots 828.

FIG. 13A to FIG. 13D illustrate a process for fabricating a semiconductor package according to an embodiment of the present disclosure. For example, this process can be used to fabricate the semiconductor package 100 described in FIG. 1.

Figure 13A:
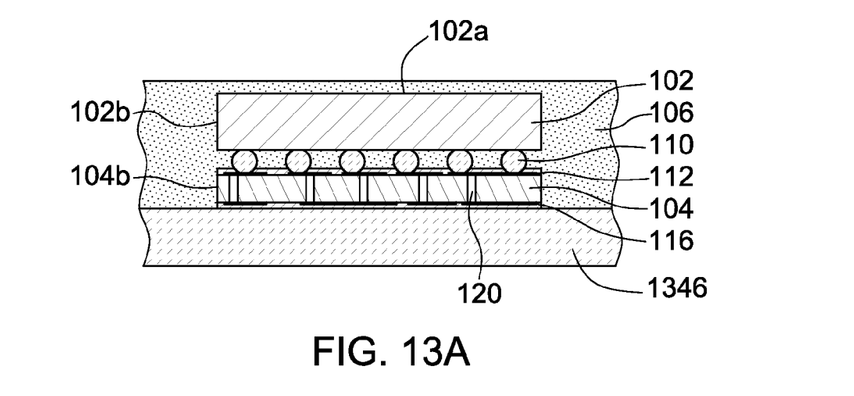
FIG. 13A, FIG. 13B, FIG. 13C and FIG. 13D illustrate a process for fabricating a semiconductor package according to an embodiment of the present disclosure.

Referring to FIG. 13A, at least one reconstitution substrate 104 is provided on an adhesive tape 1346. Such reconstitution substrate 104 may include top pads 112 on the top surface and bottom pads 116 on the bottom surface. A semiconductor device 102 is attached to the substrate 104 via a plurality of interconnectors 110, such as copper pillars or solder/stud bumps, between pads of the device 102 and respective top pads 112 of the substrate 104. A molding compound (e.g., an epoxy mold compound) 106 is applied to cover the substrate 104 and the device 102. The molding compound 106 covers the side surface 104b of the substrate 104, the side surface 102b of the device 102, and the top surface 102a of the device 102.

Figure 13B:
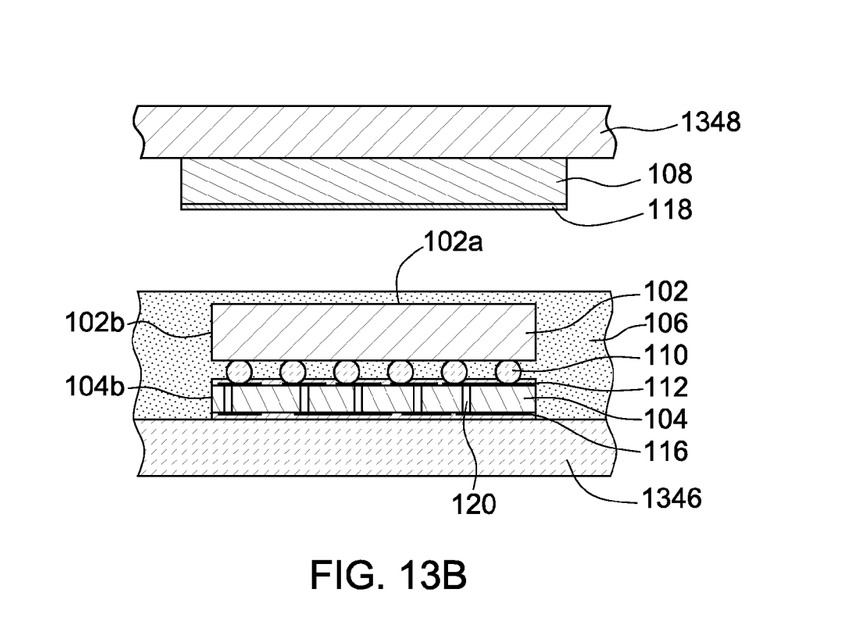

Referring to FIG. 13B, at least one thermal conductive element 108 is provided on an adhesive tape 1348. Such thermal conductive element 108 may be a reconstitution thermal conductive element. That is, the thermal conductive element 108 can be manufactured in a panel format. The panel is cut into individual thermal conductive element pieces as desired. Individual thermal conductive element pieces can then be provided on the adhesive tape 1348 based on the size and position of the dice to be attached. Different sizes of dice may be incorporated with different sizes of thermal conductive elements. Therefore, the usage of the reconstitution thermal conductive element may provide SIP flexibility to provide each device with a thermal conductive element having a corresponding size. As shown in FIG. 13B, the thermal conductive element 108 is provided with an adhesive 118 so that it can be attached to the surface of the molding compound 106 through the adhesive 118 when the thermal conductive element 108 is moved toward and pressed against the molding compound 106 together with the adhesive tape 1348.

Figure 13C:
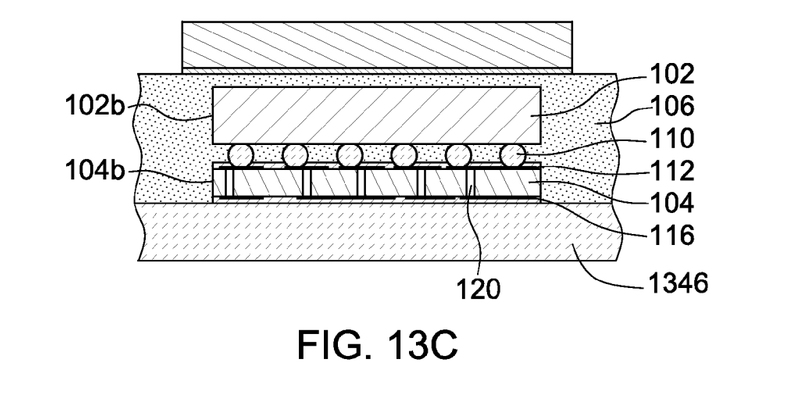

Referring to FIG. 13C, after the thermal conductive element 108 is attached to the surface of the molding compound 106, the adhesive tape 1348 is removed.

Figure 13D:
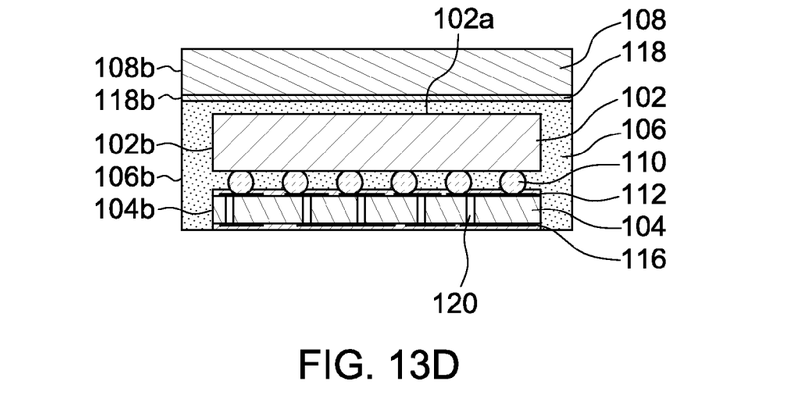

Referring to FIG. 13D, a singulation process is carried out to form a semi-package. After the singulation process, the adhesive tape 1346 is removed. Then, a plurality of solder balls (e.g., solder balls 114) may be attached to the bottom surface of the substrate 104 after the singulation process so as to obtain the semiconductor package 100 as illustrated in FIG. 1.

Figure 14A:
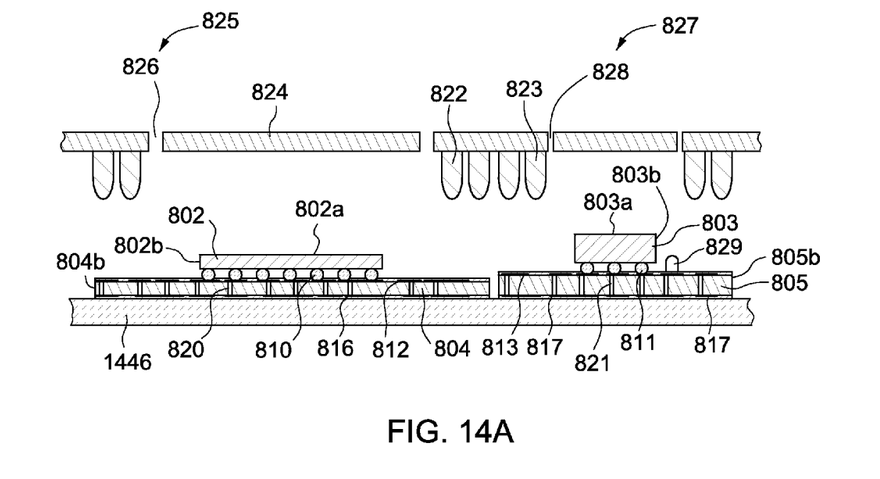
FIG. 14A and FIG. 14B illustrate a process for fabricating a semiconductor package according to another embodiment of the present disclosure.
Figure 14B:
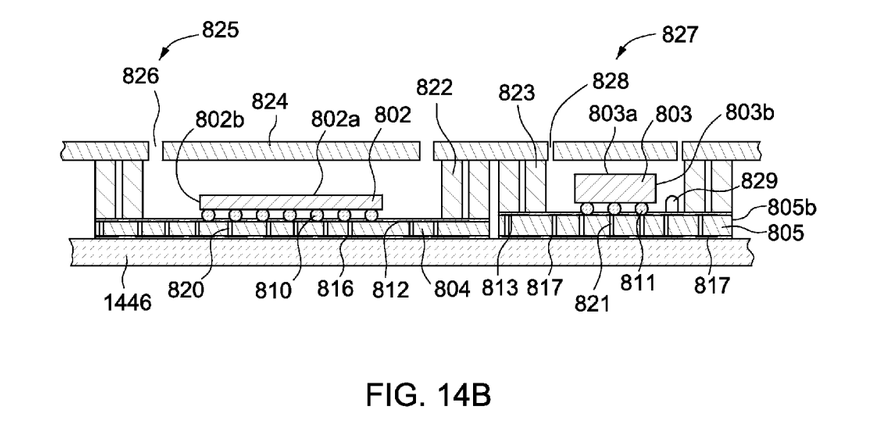

FIG. 14A to FIG. 14B illustrate a process for fabricating a semiconductor package according to another embodiment of the present disclosure. For example, this process can be used to fabricate semiconductor package 800 described in FIG. 8.

Referring to FIG. 14A, at least two reconstitution substrates (the first substrate 804 and the second substrate 805) are provided on an adhesive tape 1446, and a third substrate 824 is provided above the reconstitution substrates. The first substrate 804 and the second substrate 805 of this embodiment are the same as the first substrate 804 and the second substrate 805 of FIG. 8, respectively. The first reconstitution substrate 804 includes top pads 812 on the top surface and bottom pads 816 on the bottom surface. The second reconstitution substrate 805 includes top pads 813 on the top surface and bottom pads 817 on the bottom surface. The first reconstitution substrate 804 and the second reconstitution substrate 805 may be different in size.

The first device 802 and the second device 803 of this embodiment are the same as the first device 802 and the second device 803 of FIG. 8, respectively.

The first device 802 is electrically connected to the top surface of the first substrate 804 through the top pads 812 of the first substrate 804; and the second device 803 is electrically connected to the top surface of the second substrate 805 through the top pads 813 of the second substrate 805. The first device 802 and the second device 803 may be different in size and/or function. The second substrate 805 may include a passive component 829 disposed thereon.

The third substrate 824 is the same as the third substrate 824 of FIG. 8. The first electrical connecting elements 822 and the second electrical connecting elements 823 are disposed on the bottom surface of the third substrate 824. The third substrate 824 may further include the first slot pattern 825 and the second slot pattern 827. The first slot pattern 825 includes four first slots 826, and the second slot pattern 827 includes four second slots 828.

Referring to FIG. 14B, the third substrate 824 is attached to, and electrically connected to, the first substrate 804 and the second substrate 805 through the first electrical connecting elements 822 and the second electrical connecting elements 823, respectively.

Then, the molding compound (e.g., an epoxy mold compound) 806 is applied to fill the space between the first substrate 804, the second substrate 805 and the third substrate 824, and the space between the third substrate 824 and the adhesive tape 1446, so that the molding compound 806 covers the substrates 804, 805 and the devices 802, 803. In this embodiment, the molding compound 806 covers the side surface 804b of the first substrate 804 and the side surface 805b of the second substrate 805, and further enters the first slots 826 and the second slots 828.

Then, a singulation process is carried out to form a semi-package containing two devices 802, 803. After the singulation process, the adhesive tape 1446 is removed. Then, the solder balls (e.g., solder balls 814, 815) are attached to the first substrate 804 and the second substrate 805, respectively, so as to obtain the semiconductor package 800 as illustrated in FIG. 8.

Figure 15A:
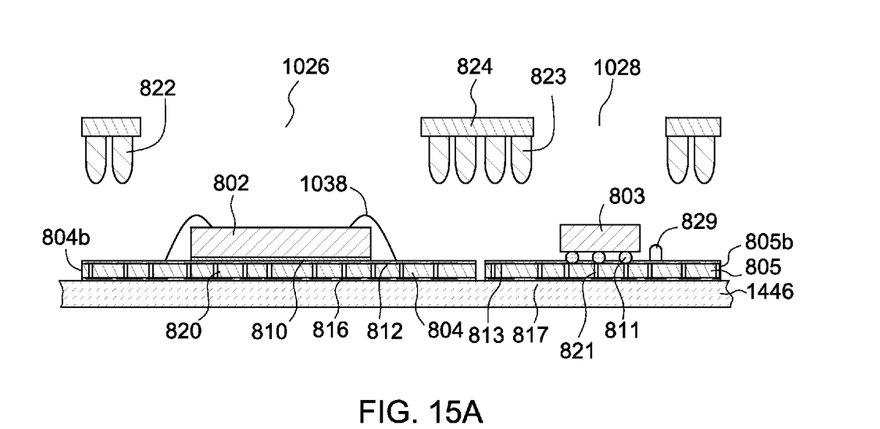
FIG. 15A and FIG. 15B illustrate a process for fabricating a semiconductor package according to another embodiment of the present disclosure.
Figure 15B:
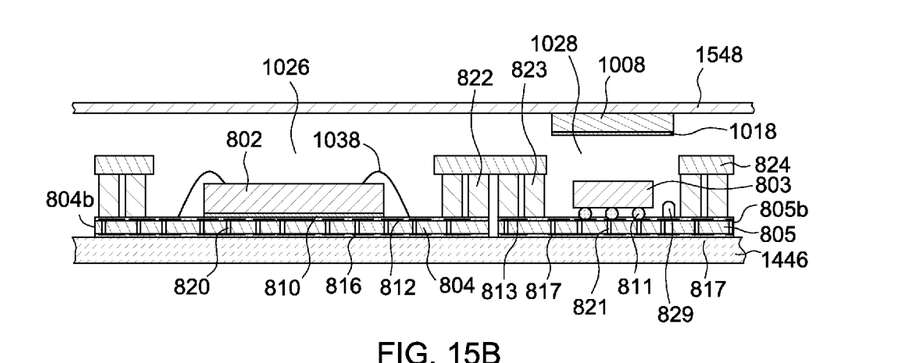

FIG. 15A to FIG. 15B illustrate a process for fabricating a semiconductor package according to another embodiment of the present disclosure. For example, this process can be used to fabricate semiconductor package 1000 described in FIG. 10.

Referring to FIG. 15A, at least two reconstitution substrates (the first substrate 804 and the second substrate 805) are provided on an adhesive tape 1446, and a third substrate 824 is provided above the reconstitution substrates. The first substrate 804 and the second substrate 805 of this embodiment are the same as the first substrate 804 and the second substrate 805 of FIG. 10, respectively. The first reconstitution substrate 804 and the second reconstitution substrate 805 may be different in size.

The first device 802 and the second device 803 of this embodiment are the same as the first device 802 and the second device 803 of FIG. 10, respectively. The first device 802 and the second device 803 may be different in size and/or function. The second substrate 805 may include a passive component 829 disposed thereon.

The third substrate 824 is the same as the third substrate 824 of FIG. 10.

The first electrical connecting elements 822 and the second electrical connecting elements 823 are disposed on the bottom surface of the third substrate 824. The third substrate 824 may further include a first opening 1026 and a second opening 1028.

Referring to FIG. 15B, the third substrate 824 is attached to, and electrically connected to, the first substrate 804 and the second substrate 805 through the first electrical connecting elements 822 and the second electrical connecting elements 823, respectively. Then, at least one thermal conductive element 1008 is provided on an adhesive tape 1548. As described above for FIG. 13B, such thermal conductive element 1008 may be a reconstitution thermal conductive element. The thermal conductive element 1008 is provided with an adhesive 1018 so that it can be attached to the surface of the second device 803 when the thermal conductive element 1008 is moved toward to the second opening 1028 and pressed against the second device 803 together with the adhesive tape 1548.

Then, the molding compound (e.g., an epoxy mold compound) 806 is applied to fill the space between the first substrate 804, the second substrate 805 and the third substrate 824, and the space between the third substrate 824 and the adhesive tape 1446, so that the molding compound 806 covers the substrates 804, 805 and the devices 802, 803. In this embodiment, the molding compound 806 covers the side surface 804b of the first substrate 804 and the side surface 805b of the second substrate 805, and further enters the first opening 1026 and the gap between side wall of the second opening 1028 and the thermal conductive element 1008.

Then, a singulation process is carried out to form a semi-package containing two devices 802, 803. After the singulation process, the adhesive tape 1446 is removed. Then, the solder balls (e.g., solder balls 814, 815) are attached to the first substrate 804 and the second substrate 805 so as to obtain the semiconductor package 1000 as illustrated in FIG. 10.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In some embodiments, two surfaces can be deemed to be coplanar or substantially coplanar if a displacement between the two surfaces is small, such as no greater than 1 μm, no greater than 5 μm, or no greater than 10 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate;
   a semiconductor device mounted to the substrate;
   an adhesive disposed above the semiconductor device;
   a thermal conductive element disposed above the adhesive; and
   a molding compound covering a side surface of the substrate and at least a part of a side surface of the semiconductor device;
   wherein a lateral surface of the thermal conductive element is coplanar with a lateral surface of the adhesive.

2. The semiconductor package of claim 1, wherein a side surface of the molding compound is coplanar with a side surface of the thermal conductive element.

3. The semiconductor package of claim 1, wherein the molding compound covers the entire side surface of the semiconductor device, and the molding compound further covers a part of a side surface of the thermal conductive element.

4. The semiconductor package of claim 1, wherein the molding compound covers a top surface of the semiconductor device.

5. A semiconductor package, comprising:
   a first substrate;
   a second substrate;
   a first semiconductor device mounted to the first substrate;
   a second semiconductor device mounted to the second substrate;
   a first adhesive disposed above the first semiconductor device;
   a first thermal conductive element disposed above the first adhesive; and
   a molding compound covering a side surface of the first substrate, a side surface of the second substrate, at least a part of a side surface of the first semiconductor device and at least a part of a side surface of the second semiconductor device;

wherein a lateral surface of the first thermal conductive element is coplanar with a lateral surface of the first adhesive.

6. The semiconductor package of claim 5, wherein the first semiconductor device is different from the second semiconductor device.

7. The semiconductor package of claim 5, wherein the first adhesive is disposed above the first semiconductor device and the second semiconductor device.

8. The semiconductor package of claim 5, further comprising:

a second adhesive disposed above the second semiconductor device;

a second thermal conductive element disposed above the second adhesive;

wherein a size of the first thermal conductive element is different from a size of the second thermal conductive element, a lateral surface of the second thermal conductive element is coplanar with a lateral surface of the second adhesive.

9. The semiconductor package of claim 5, wherein the molding compound covers the entire side surfaces of the first semiconductor device and the second semiconductor device, and the molding compound further covers a part of a side surface of the first thermal conductive element.

10. The semiconductor package of claim 5, wherein the molding compound covers top surfaces of the first semiconductor device and the second semiconductor device.

11. A semiconductor package, comprising:

a first substrate;

a second substrate;

a first semiconductor device mounted to the first substrate;

a second semiconductor device mounted to the second substrate;

a third substrate disposed above the first semiconductor device and the second semiconductor device and electrically connected to the first substrate and the second substrate; and a molding compound covering a side surface of the first substrate, a side surface of the second substrate, at least a part of a side surface of the first semiconductor device and at least a part of a side surface of the second semiconductor device;

wherein the first semiconductor device is disposed between the first substrate and the third substrate, and the second semiconductor device is disposed between the second substrate and the third substrate.

12. The semiconductor package of claim 11, wherein the first semiconductor device is different from the second semiconductor device.

13. The semiconductor package of claim 11, wherein a side surface of the molding compound is coplanar with a side surface of the third substrate.

14. The semiconductor package of claim 11, wherein the molding compound covers the entire side surfaces of the first semiconductor device and the second semiconductor device.

15. The semiconductor package of claim 11, wherein the molding compound fills a space between the first substrate, the second substrate and the third substrate.

16. The semiconductor package of claim 11, further comprising a third semiconductor device, wherein the third semiconductor device is disposed between the first semiconductor device and the third substrate, and the third semiconductor device is electrically connected to the third substrate.

17. The semiconductor package of claim 16, wherein the third substrate defines an accommodating cavity for accommodating the third semiconductor device.

18. The semiconductor package of claim 11, wherein the third substrate defines a first opening corresponding to the first semiconductor device, and the molding compound is further disposed in the first opening.

19. The semiconductor package of claim 18, further comprising a third semiconductor device, wherein the third semiconductor device is disposed in the first opening.

20. The semiconductor package of claim 11, further comprising a thermal conductive element disposed above the second semiconductor device.

* * * * *